United States Patent [19]
Swanson

[11] Patent Number: 5,132,637
[45] Date of Patent: Jul. 21, 1992

[54] RF POWER AMPLIFIER SYSTEM HAVING IMPROVED DISTORTION REDUCTION

[75] Inventor: Hilmer I. Swanson, Quincy, Ill.

[73] Assignee: Harris Corporation, Melbourne, Fla.

[21] Appl. No.: 675,537

[22] Filed: Mar. 25, 1991

[51] Int. Cl.⁵ .......................... H03F 3/38; H03F 1/26
[52] U.S. Cl. ..................... 330/10; 330/149; 455/126
[58] Field of Search ............ 330/10, 207 A, 251, 330/149; 332/107, 109, 110; 455/126

[56] References Cited

U.S. PATENT DOCUMENTS 4,571,551 2/1986 Trager .................................. 330/10
4,745,368 5/1988 Lodahl .................................. 330/10

Primary Examiner—Steven Mottola
Attorney, Agent, or Firm—Tarolli, Sundheim & Covell

[57] ABSTRACT

An RF power amplifier system is provided having improved distortion reduction. This system includes a plurality of actuatable RF power amplifiers, each connected to a DC voltage source and each having an input circuit for when actuated receiving and amplifying an RF drive signal and each having an output circuit for providing an amplified RF output signal. One or more of these RF power amplifiers are actuated, turned on, in dependence upon the magnitude of an input audio frequency signal. The RF output signals are additively combined to provide a combined RF output signal. RF output signal detector means are connected to the output circuit of at least one of the RF power amplifiers for providing a correction signal having a value which varies as a function of the value of the RF voltage detected at the output circuit. The correction signal is combined with the input signal prior to actuation of one or more of the RF power amplifiers.

8 Claims, 3 Drawing Sheets

RF POWER AMPLIFIER SYSTEM HAVING IMPROVED DISTORTION REDUCTION

BACKGROUND AND FIELD OF THE INVENTION

The present invention relates to RF power amplifiers and, more particularly, to such amplifiers including means for minimizing distortion caused by noise including that resulting from variations in the DC power supply as well as from noise generated by transistor switches located within the RF power amplifiers.

Circuits are known for minimizing signal distortion in RF power amplifiers used in AM transmitters. For example, the U.S. Pat. Nos. to H. Swanson et al. 4,737,731, H. I. Swanson 4,580,111 and D. H. Covill 4,605,910 provide examples of such circuits. Thus, each of these patents discloses circuitry for minimizing modulation distortion of an amplitude modulated RF carrier signal resulting from variations in the DC power supply. In each case, a feed forward technique is employed in which a sample of the input DC voltage signal is obtained and is combined with the input audio signal to compensate for variations in the magnitude of the DC supply voltage prior to supplying the signal to the amplification stages of the transmitter. This feed forward technique, therefore, does not compensate for additional noise resulting as from noisy switches in the amplifier stages.

The H. I. Swanson U.S. Pat. No. 4,580,111 additionally discloses an amplitude modulator which generates an amplitude modulated carrier signal by selectively turning on and off a plurality of RF amplifiers in a digital manner to produce amplitude modulation. Each of the RF amplifiers includes a plurality of switching transistors, each of which takes the form of a MOSFET transistor, connected together in a bridge circuit. The output terminals of each bridge circuit are connected across a primary winding of a transformer having a secondary winding. The secondary windings of all of the power amplifiers are connected together in series for combining the amplified RF signals. The combined RF signal is supplied to a load, such as an antenna. The output of the power amplifiers can change with the level of RF output current. The same RF current flows in all of the power amplifiers. When the first power amplifier turns on, there is very little current flowing. When the second power amplifier turns on, the RF current doubles. As more and more amplifiers are turned on, the RF current increases to a relatively high level. When the RF current increases to a sufficiently high RF level, the on impedance of the transistor switches increases in magnitude. This will cause the voltage drop across these switching transistors to increase, thereby decreasing the RF voltage output from each power amplifier. Consequently, compensation is needed to offset the signal distortion resulting from operating such switching transistors at high RF current levels as well as from the variations in power supply discussed hereinabove.

SUMMARY OF THE INVENTION

In an accordance with the present invention, an RF power amplifier system is provided having improved distortion reduction. This system includes a plurality of actuatable RF power amplifiers, each connected to a DC voltage source and each having an input circuit for, when actuated, receiving and amplifying an RF drive signal and each having an output circuit for providing an amplified RF output signal. One or more of these RF power amplifiers are actuated in dependence upon the magnitude of an input audio frequency signal. The RF output signals are additively combined to provide a combined RF output signal. RF output signal detector means are connected to the output circuit of at least one of the RF power amplifiers for providing a correction signal having a value which varies as a function of the value of the RF voltage detected at the output circuit. The correction signal is combined with the input signal prior to actuation of one or more of the RF power amplifiers.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF PREFERRED EMBODIMENT

One application of the present invention is in conjunction with protecting RF power amplifiers employed in an AM broadcast transmitter. An example of such a transmitter is presented in FIG. 1 and takes the form of a digital amplitude modulator such as that illustrated and described in my aforesaid U.S. Pat. No. 4,580,111, which is assigned to the same assignee as the present invention, the disclosure of which is herein incorporated by reference.

Figure 1:
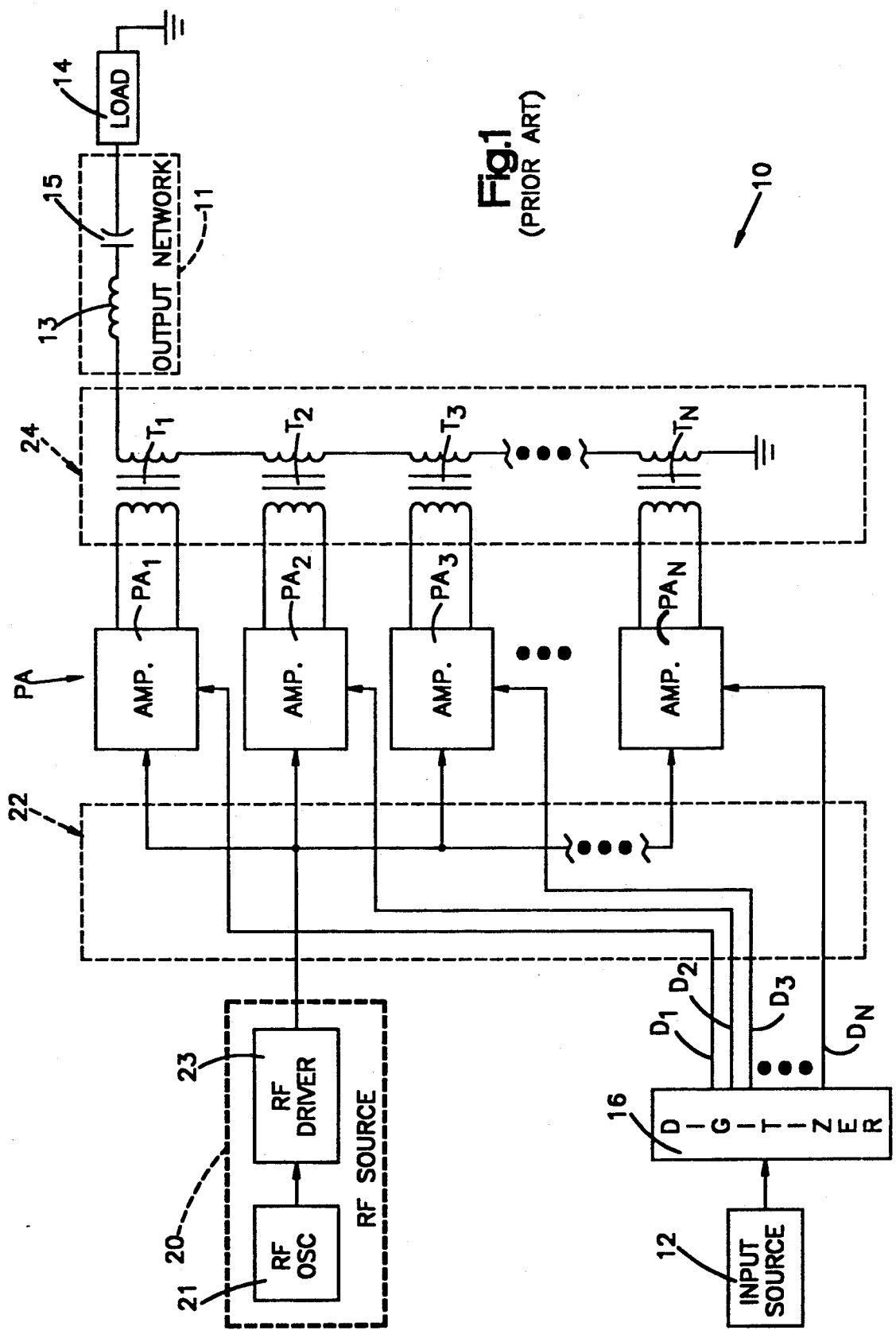
FIG. 1 is a prior art schematic-block diagram illustration of one application to which the present invention may be applied.
Figure 2A:
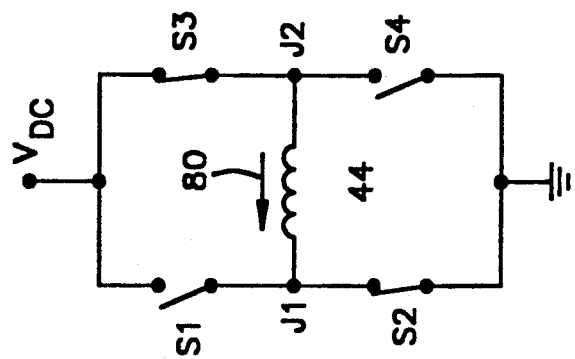
FIG. 2A is a prior art simplified schematic circuit useful in understanding the operation of the circuit shown in FIG. 2.
Figure 2:
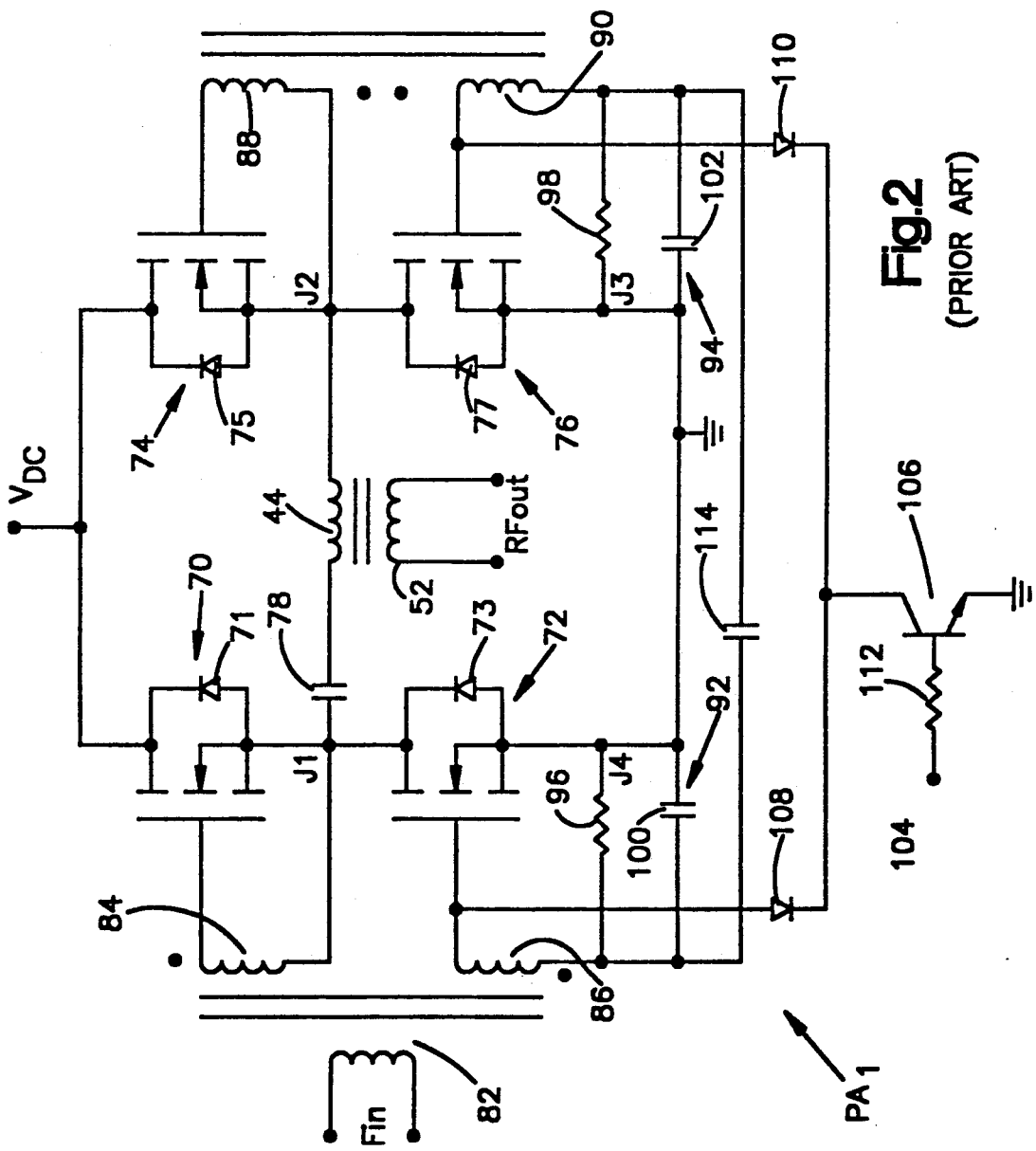
FIG. 2 is a prior art schematic circuit illustration of one of the power amplifiers employed in FIG. 1.
Figure 3:
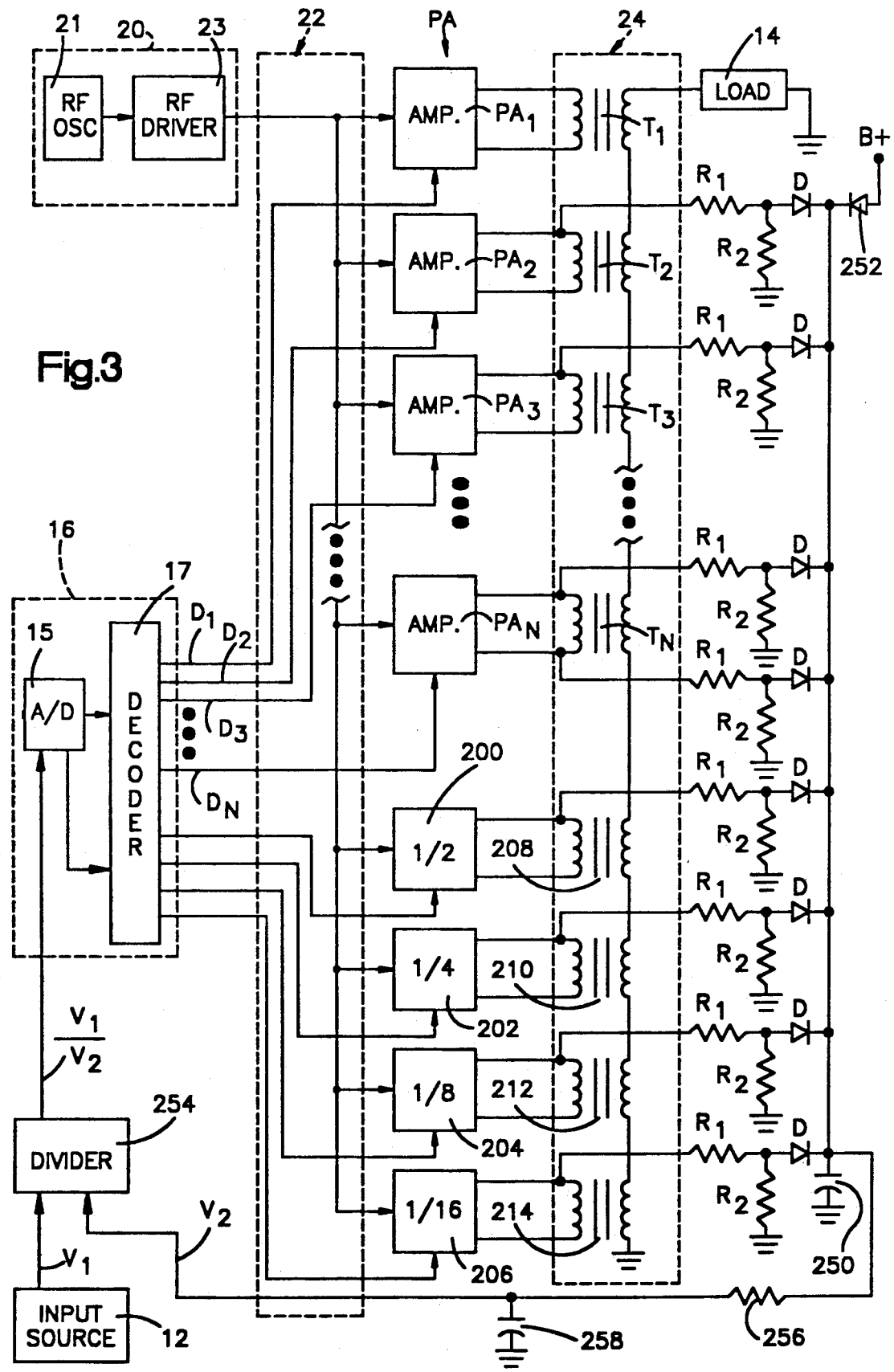
FIG. 3 is a schematic-block diagram illustration of one embodiment of the present invention.

The discussion which follows is directed to an explanation of the operation of the circuitry shown in FIG. 1 followed by a detailed description of a power amplifier as illustrated in FIGS. 2 and 2A herein as background for the discussion of the invention presented with respect to the embodiment illustrated herein in FIG. 3.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1–DN is supplied to one of a plurality of N RF power amplifiers $PA_1$–$PA_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1-PA_N$ receives a signal of like amplitude and phase and frequency. The carrier signal is amplitude modulated in accordance with the control signals D1-DN and the amplitude modulated carrier signals will be of like frequency and phase. These signals are supplied to a combiner circuit 24 comprised of a plurality of transformers $T_1, T_2, T_3, \ldots, T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1-PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1-PA_N$.

FIG. 2 illustrates one form which the power amplifier $PA_1$ of FIG. 1 may take, the other power amplifiers $PA_2-PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer 36 is connected across the bridge junctions $J_1$ and $J_2$ of the four semiconductor elements.

More particularly, the semiconductor amplifier elements are metal oxide semiconductor, field effect transistors (MOSFETs) having three electrodes, conventionally identified as the gate, drain, and source. The drain-source paths of the transistors 70 and 72, representing their primary current paths, are connected in series across the C power supply, as are the drain-source current paths of transistors 74 and 76. The primary winding 44 of the corresponding combiner transformer T1 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1, S_2, S_3$, and $S_4$. As shown in FIG. 2A, the switch $S_1$ is open and the switch $S_2$ is closed, whereby the common junction $J_1$ between them is grounded. The switch $S_3$ is closed and the switch $S_4$ open, however, whereby the junction $J_2$ between those switches is connected to the C supply voltage. Current will therefore pass through the primary winding 44 in the direction indicated by the arrow 80.

When all four switches $S_1-S_4$ are thrown to their opposite states, current will pass through the output winding 44 in the opposite direction. Thus, when switches $S_1$ and $S_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1-S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary windings of a single transformer. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70-76. The secondary 84 is directly connected between the gate MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETS 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will e described hereinafter during the description of the amplifier control circuitry 104.

The primary winding 82 of the toroidal transformer is connected to the output of the RF source 20, which provides a sinusoidal RF driving voltage to the power amplifier. Each MOSFET turns "on" when the RF signal applied to its gate is on its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of the windings 84 and 90. The signals applied to the gates of MOSFETs 70 and 76 are therefore 180° out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only a fundamental component of this squarewave.

As shown in FIG. 2, the power amplifier $PA_1$ includes a switching circuit 104 for turning the power amplifier on and off in response to the control signal appearing on the digitizer output line $D_1$. The switching circuit 104 includes an NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e., logic "1"), base current is applied to the transistor 1056, forcing it into a saturation. The gates of the transistors 72 and 76 are then effectively grounded through the corresponding diodes 108 and 110. This has the effect of clamping the gate signals of these transistors to a ground potential, thereby forcing both of them to remain in an "off" condition. The primary winding 44 is thus effectively disconnected from ground, thereby turning off the power amplifier. When the control signal $D_1$ applied to the emitter resistor 112 has a low logic level (i.e., logic "0"), however, the transistor 106 is cut off and the operation of the amplifier 26 is substantially as described previously.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

One of the problems associated with operating power amplifiers as described hereinabove is that the same RF current flows in all of the power amplifiers and as the number of power amplifiers that are turned increases, the magnitude of the RF current increases. However, as the magnitude of the RF current increases, the impedance of the switching transistors also increases resulting in a decrease in the RF output voltage. Thus, the MOSFETs 70, 72, 74 and 76 are not perfect and at high RF current levels it has been determined that their impedance will increase somewhat. This will present an increase in the voltage drop across the transistor switches causing the RF output voltage to decrease. If this situation is left uncorrected, it will result in information distortion in the signals being transmitted by the AM transmitter. Moreover, this would compound any other distortions such as that resulting from variations in the DC supply voltage.

In accordance with the present invention, circuitry is provided for reducing the distortion out of the transmitter caused by variations in the power supply as well as by variations in the impedance of the switching transistors during their operation, particularly when operating at high RF current levels.

Reference is now made to FIG. 3 which incorporates the circuitry of FIG. 1 discussed hereinbefore together with some additional components as well as circuitry for minimizing distortion in accordance with the present invention. The additional components in FIG. 3 include power amplifiers 200, 202, 204 and 206. Each of these power amplifiers provides, when operating, a fraction of the power provided by each of the power amplifiers $PA_1$ through $PA_N$ discussed hereinbefore. The amount of power contributed by power amplifiers 200-206 is reduced as by increasing the turns ratio of their output transformers. Thus, whereas the output transformer for each of the power amplifiers $PA_1$ through $PA_N$ may have a turns ratio of 11:1, for example, the output transformer for power amplifier 200 has a turns ratio of 22:1, whereas that for the output transformer the amplifier 202 has a turns ratio of 44:1. Power amplifiers 200 and 202 therefore respectively contribute only one-half and one-fourth, respectively, of the power contributed by each of the preceding amplifiers $PA_1$ through $PA_N$. Likewise, the turns ratio for power amplifiers 204 and 206 may be adjusted as 88:1 and 176:1 so that the power contributed by these two amplifiers is respectively one-eighth and one sixteenth of that contributed by each of the power amplifiers $PA_1$ through $PA_N$. Thus, power amplifiers 200 through 206 may be considered as the binary power amplifiers each of which provides a fraction of the amount of power provided by each of the power amplifiers $PA_1$ through $PA_N$.

The circuitry described thus far in FIG. 3 is essentially that as disclosed in FIG. 4 of my aforesaid U.S. Pat. No. 4,580,111. The power amplifiers $PA_1$ through $PA_N$ may be considered as big step power amplifiers whereas the binary amplifiers 200 through 206 may be looked upon as little step power amplifiers.

The digitizer 16 of FIG. 3 is shown as including an analog-to-digital converter 15 and a decoder 17. The analog-to-digital converter in this example may have a twelve bit output with the five most significant bits being used to select one of the big step power amplifiers $PA_1$ through $PA_N$ where N has a value of 31. This is in keeping with the discussion of FIG. 4 in my aforesaid U.S. Pat. No. 4,580,111. Moreover, the decoder 17 also includes circuitry for selecting for active participation one or more of the little step amplifiers 200 through 206 by looking at the four next most significant bits of the twelve bit binary word provided at the output of the analog-to-digital converter 15. These four next most significant bits (i.e., 6 MSB-9 MSB) of the twelve bit binary word are used to select one or more of the binary little step power amplifiers 200 through 206.

The weighting of these power amplifiers is accomplished by varying the turns ratio of the output transformers as discussed hereinabove. These are the output transformers 208, 210, 212 and 214 respectively provided in the output circuits of amplifiers 200, 202, 204 and 206. The secondary windings of these transformers are connected in series with the secondary windings of the transformers connected to the output circuits of power amplifiers $PA_1$ through $PA_N$ in the combiner circuit 24. The additive sum of these RF signals is then supplied to the load 14, such as a transmitting antenna.

Depending upon how many power amplifiers $PA_1$ through $PA_N$ as well as how many little step power amplifiers 200 through 206 are turned on will determine the magnitude of the output RF current. Since all of the windings are coupled together the same RF current flows in all of the output circuits of the power amplifiers. When the first power amplifier turns on, there is very little RF current flowing. When a second power amplifier turns on, the RF current doubles. As the RF current increases, the voltage drop across a power amplifier will tend to increase because at high levels of RF current, the on resistance of the MOSFETs (see MOSFETs 70, 72, 74 and 76 in FIG. 2) will increase in magnitude. Consequently, the RF output voltage will drop accordingly. This will result in a distorted output from the transmitter along with any distortions caused by variations in the line voltage which will cause a variation in the DC voltage $V_{DC}$ supplied to each of the power amplifiers (see FIG. 2).

The present invention provides circuitry for correcting for this voltage drop and thereby minimizing distortion. As will be seen from the discussion that follows, the circuitry employed serves to detect any RF voltage out of several of the power amplifiers (not necessarily all of the power amplifiers) and gates the signals together and employs a feedback scheme to correct for changes in amplifier output. Also, the output from several of the big step power amplifiers (i.e., power amplifiers $PA_1$ through $PA_N$) are rectified and gated together so that the loss of one amplifier will not remove the feedback signal. Also, the outputs of the binary amplifiers (amplifiers 200-206) are adjusted, as will be described hereinafter, so as to be of the same magnitude as that obtained from one of the big step amplifiers and gated together with the signals from the big step amplifiers.

Reference is now made to FIG. 3 from which it will be noted that an RF detector circuit is connected to the outputs of several (but not all) of the big step power amplifiers $PA_1$ through $PA_N$ as well as to the outputs of some of the little step amplifiers 200, 202, 204 and 206. Each of the detector circuits includes resistors $R_1$ and $R_2$ together with a rectifying diode D. As shown, these RF detector circuits are connected to the output circuits of the big step power amplifiers $PA_2$, $PA_3$ and $PA_N$. Similarly, an RF detector circuit is connected to the RF output of each of the small step or binary power amplifiers 200, 202, 204 and 206. Also, whereas an RF detecting circuit has been provided for each of the binary amplifiers 200-206, it is to be appreciated that in practice such detecting circuits may only need to be employed with some of those amplifiers, such as amplifiers 204 and 206.

It is to be noted that two RF detecting circuits are shown as being connected to the output of the big step power amplifier $PA_N$. An extra detecting circuit may be employed with various of the power amplifiers for detecting the voltages as the current flows in alternating directions through each of the power amplifier output circuits. The RF detector circuits rectify the RF voltages obtained from the power amplifiers so as to develop a voltage $V_2$ which appears across a capacitor 250. A DC voltage taken from the B+ terminal is supplied by way of a diode 252 and serves to insure that a positive signal is supplied to the divider 254 by way of a feedback circuit including resistor 256 and capacitor 258. This positive voltage serves to limit the range of the feedback signal. Providing that the output voltage $V_2$ exceeds that of the B+ voltage supply source, then the feedback signal will correspond with the magnitude of the voltage $V_2$ which is supplied to the divider 254. The feedback voltage $V_2$ is combined with the input voltage $V_1$ from the input source 12 so as to cancel any variations in the output signal $V_2$ caused by variations in the line voltage as well as variations in the impedances in the power amplifiers such as when several amplifiers are on resulting in a high RF output current.

It is to be noted that the RF detector circuits connected to the big step power amplifiers $PA_1$ through $PA_N$ include resistors $R_1$ and $R_2$ connected together with the primary windings of the transformers $T_1$ through $T_N$ so as to gate the rectified output voltages together. Since the big step amplifiers $PA_1$ through $PA_N$ provide outputs having equal amplitude, the resistance values of all resistors $R_1$ may be equal and the resistance values of all resistors $R_2$ may be equal. However, in order to obtain the same magnitude of output voltage from the RF detectors employed with the binary power amplifiers 200-206, the values of the resistors $R_1$ and $R_2$ may be varied somewhat to achieve this result. Consequently, the output voltage of each of the binary amplifiers is adjusted so as to be of the same size as the output of each of the bit step power amplifiers with all of these output voltages then being gated together through the diodes D.

Although the invention has been described in conjunction with a preferred embodiment, it is to be appreciated that various modifications may be made without departing from the spirit and scope of the invention as defined by the appended claims.

Having described the invention, the following is claimed:

1. An RF power amplifier system having distortion reduction and comprising:
   a DC voltage source;
   an RF source for providing an RF drive signal;
   a plurality of actuatable RF power amplifiers, each connected to said DC source, and each when activated for receiving and amplifying said RF drive signal, and each having an output circuit for providing an amplified RF output signal;
   means for providing an input signal;
   means for actuating a selected one or more of said RF amplifiers in dependence upon the magnitude of said input signal;
   means for additively combining said RF output signals to provide a combined RF output signal;
   RF output signal detector means connected to the output circuit of at least one of said RF power amplifiers for providing a correction signal having a value which varies as a function of any RF voltage detected at said output circuit;
   means for combining said correction signal with said input signal prior to actuation of one or more of said RF amplifiers; and
   wherein said means for combining includes means for dividing said input signal by said correction signal.

2. An RF power amplifier system having distortion reduction and comprising:
   a DC voltage source;
   an RF source for providing an RF drive signal;
   a plurality of actuatable RF power amplifiers, each connected to said DC source, and each when activated for receiving and amplifying said RF drive signal, and each having an output circuit for providing an amplified RF output signal;
   means for providing an input signal;
   means for actuating a selected one or more of said RF amplifiers in dependence upon the magnitude of said input signal;
   means for additionally combining said RF output signals to provide a combined RF output signal;

RF output signal detector means connected to the output circuit of at least one of said RF power amplifiers for providing a correction signal having a value which varies as a function of any RF voltage detected at said output circuit;

means for combining said correction signal with said input signal prior to actuation of one or more of said RF amplifiers;

said detector means provides said correction signal having a value proportional to that of said detected RF voltage; and, wherein said RF output signal detector means includes rectifying means for providing said correction signal as a DC signal of a magnitude proportional to that of said detected RF voltage at said output circuit.

3. An RF power amplifier system as set forth in claim 2 wherein said means for combining includes means for dividing said input signal by said correction signal.

4. An RF power amplifier system as set forth in claim 2 wherein said RF output signal detector means includes resistor means connected to said rectifying means for use in providing said correction signal.

5. An RF power amplifier system as set forth in claim 2 including a plurality of said RF output signal detector means, each connected to the output circuit of one of said plurality of RF power amplifiers for providing a plurality of said correction signals, and means for gating said correction signals together to provide a combined correction signal.

6. An RF power amplifier system as set forth in claim 5 wherein said plurality of RF output signal detector means is less than said plurality of RF power amplifiers.

7. An RF power amplifier system as set forth in claim 5 wherein said plurality of RF power amplifiers includes a first plurality of RF power amplifiers and a second plurality of RF power amplifiers, each power amplifier of said first plurality of provides a first RF carrier signal and wherein each RF power amplifier of said second plurality provides a second RF carrier signal having an amplitude which is a fraction of the amplitude of a said first RF carrier signal.

8. An RF power amplifier system as set forth in claim 7 wherein said RF output signal detector means is connected to the output circuit of some, but not all, of said first plurality of RF power amplifiers and to some, but not all, of said second plurality of said RF power amplifiers.

* * * * *

UNITED STATES PATENT AND TRADEMARK OFFICE
CERTIFICATE OF CORRECTION

PATENT NO. : 5,132,637

DATED : July 21, 1992

INVENTOR(S) : Hilmer I. Swanson

It is certified that error appears in the above-identified patent and that said Letters Patent is hereby corrected as shown below:

Column 10, Line 13, Claim 7, "of" (second occurrence) should be deleted.

Column 10, Line 21, Claim 8 change "circuit" to --circuits--.

Signed and Sealed this

Seventeenth Day of August, 1993

Attest:

BRUCE LEHMAN

Attesting Officer     Commissioner of Patents and Trademarks